(12) United States Patent
Bidin et al.

(10) Patent No.: US 8,544,755 B2
(45) Date of Patent: Oct. 1, 2013

(54) SUBSCRIBER IDENTITY MODULE (SIM) CARD

(75) Inventors: Rahamat Bidin, Singapore (SG); Hao Liu, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 45 days.

(21) Appl. No.: 13/171,421

(22) Filed: Jun. 28, 2011

(65) Prior Publication Data
US 2011/0315779 A1 Dec. 29, 2011

Related U.S. Application Data

(60) Provisional application No. 61/358,993, filed on Jun. 28, 2010.

(51) Int. Cl.
*G06K 19/06* (2006.01)
(52) U.S. Cl.
USPC .......................................... 235/492; 235/487

(58) Field of Classification Search
CPC ................................................ G06K 19/07749
USPC .................................................. 235/487, 492
See application file for complete search history.

(56) References Cited

U.S. PATENT DOCUMENTS

| | | | | |
|---|---|---|---|---|
| 7,252,242 | B2 * | 8/2007 | Ho | 235/492 |
| 7,692,280 | B2 * | 4/2010 | Koch et al. | 257/688 |
| 7,824,223 | B1 * | 11/2010 | Masucci et al. | 439/620.22 |
| 7,922,097 | B2 * | 4/2011 | Yoshikawa et al. | 235/492 |
| 2009/0200381 | A1 * | 8/2009 | Schober et al. | 235/486 |
| 2010/0090805 | A1 * | 4/2010 | Libotte | 340/10.2 |
| 2010/0320276 | A1 * | 12/2010 | Dreyer | 235/494 |

* cited by examiner

*Primary Examiner* — Ahshik Kim
(74) *Attorney, Agent, or Firm* — Horizon IP Pte. Ltd.

(57) ABSTRACT

A SIM card is presented. The SIM card includes a support carrier having a first and a second major surface. The support carrier includes a cavity which extends partially into the carrier from the first major surface. The SIM card further includes a chip package disposed within the cavity. The support carrier is sufficiently flexible to bend when the SIM card is being inserted into or removed from a SIM card holder.

20 Claims, 5 Drawing Sheets

SUBSCRIBER IDENTITY MODULE (SIM) CARD

CROSS-REFERENCE TO RELATED APPLICATIONS

This application claims priority from U.S. Provisional Application Ser. No. 61/358,993, entitled "Hybrid SIM Card", filed on Jun. 28, 2010, the disclosure of which is incorporated herein by reference in its entirety.

BACKGROUND

A subscriber identity module (SIM) card is generally used to store information of a user, such as a subscriber of a telecommunication line. For example, a SIM card may securely store subscriber information using the International Mobile Subscriber Identity (IMSI) format. The SIM card can be inserted into a telecommunication device, such as a mobile phone or computer, for use. The SIM card allows a user to switch from one device to another device. For example, the SIM card can be removed from a device and inserted into another device.

A conventional SIM card, however, could be prone to jamming when being inserted into or removed from a SIM card slot of a telecommunication device, such as a mobile phone. We have discovered that the jamming could be due to the current practice of using rigid material to overmold the SIM cards, hence resulting in difficulty of insertion and removal of the rigid SIM cards from the card slots.

From the foregoing discussion, it is desirable to provide an improved SIM card which can be easily removed from or inserted into a device.

SUMMARY

Embodiments relate generally to multi-functional SIM cards. The SIM card can be used in portable electronic devices or handheld devices such as mobile phones. Other types of applications may also be useful. In one embodiment, a multi-functional SIM card is disclosed. The SIM card includes a support carrier having a first and second major surface. The support carrier includes a cavity which extends partially into the carrier from the first major surface. The SIM card further includes a multi-functional chip package disposed within the cavity. The support carrier is sufficiently flexible to bend when the SIM card is being inserted into or removed from a SIM card holder.

In one embodiment, a method for forming a SIM card is presented. The method includes providing a support carrier having a first and a second major surface. The support carrier includes a cavity which extends partially into the carrier from the first major surface. The method further includes attaching a chip package within the cavity, wherein the SIM card is not entirely formed from overmolding with rigid material, and the support carrier is sufficiently flexible to bend when the SIM card is being inserted into or removed from a SIM card holder.

In another embodiment, a method of forming a multi-functional SIM card is disclosed. Required ICs and components for the SIM card's desired functionality are mounted onto a package substrate, such as a PCB, and encapsulated with thermal epoxy for protection. The molded substrate is singulated to form individual multi-functional chip packages. These packages are then encased within a support carrier, such as a flexible plastic casing, that forms the rest of the SIM card body. The flexible plastic SIM card body may be formed by injection molding, with a cavity for the multi-functional chip package, which is later inserted into the card body and attached to card body's cavity by adhesive in the form of paste or film.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments relate generally to SIM cards. In one embodiment, the SIM card includes a multi-functional SIM card. The SIM card may include an IC module or chip mounted onto a support carrier or substrate. For example, the chip may include a communication device or SIM device, such as a memory or microprocessor chip. Additionally, the chip can further include other IC devices such as RF, decoder and/or security devices, as well as other types of devices or components to form a multi-functional SIM card. The SIM card can be incorporated into various mobile, portable, handheld or telecommunication products, such as mobile phones, computers, personal digital assistants or other types of suitable products.

Figure 1:
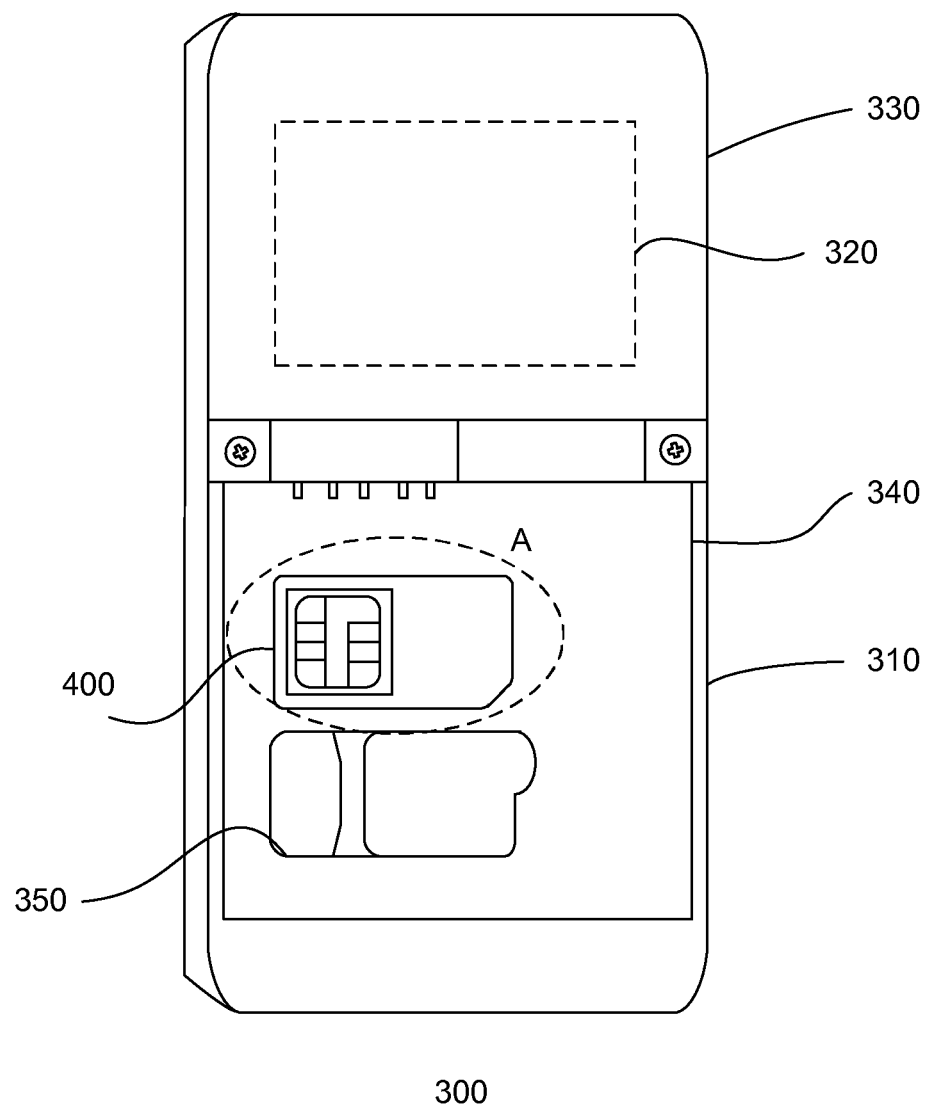
FIG. 1 shows a mobile device with an embodiment of a SIM card.

FIG. 1 shows a mobile device 300 with one embodiment of a SIM card 400. The mobile device, for example, may be a mobile phone. Providing other types of mobile or portable devices may also be useful. The mobile device, in one embodiment, includes a body 310 and a circuit board 320 received in the body. The mobile device may include a top cover 330 and a bottom cover (not shown). The top cover, for example, is fixed to the body of the mobile device whereas the bottom cover is a removable cover. Providing a top cover which is not fixed to the body of the mobile device may also be useful. The body, in one embodiment, includes a slot 340 for housing a battery (not shown). Other configurations of the mobile device may also be useful.

The body of the mobile device includes a SIM card holder 350 for receiving a SIM card. The SIM card holder, for example, may be a slot or socket in which the SIM card is inserted. Other types of SIM card holders may also be useful. The SIM card holder may be disposed on the body under the cover. For example, when the cover is removed, the SIM card holder is exposed, enabling the SIM card to be inserted or removed. Providing the SIM card holder at other locations of the body of the mobile device may also be useful. The SIM card holder includes a plurality of electrical contacts (not shown) which electrically connects the contacts of the SIM card with the circuit board of the mobile device. Other components, such as a camera (not shown), etc., may also be included in the mobile device.

Figure 2A:
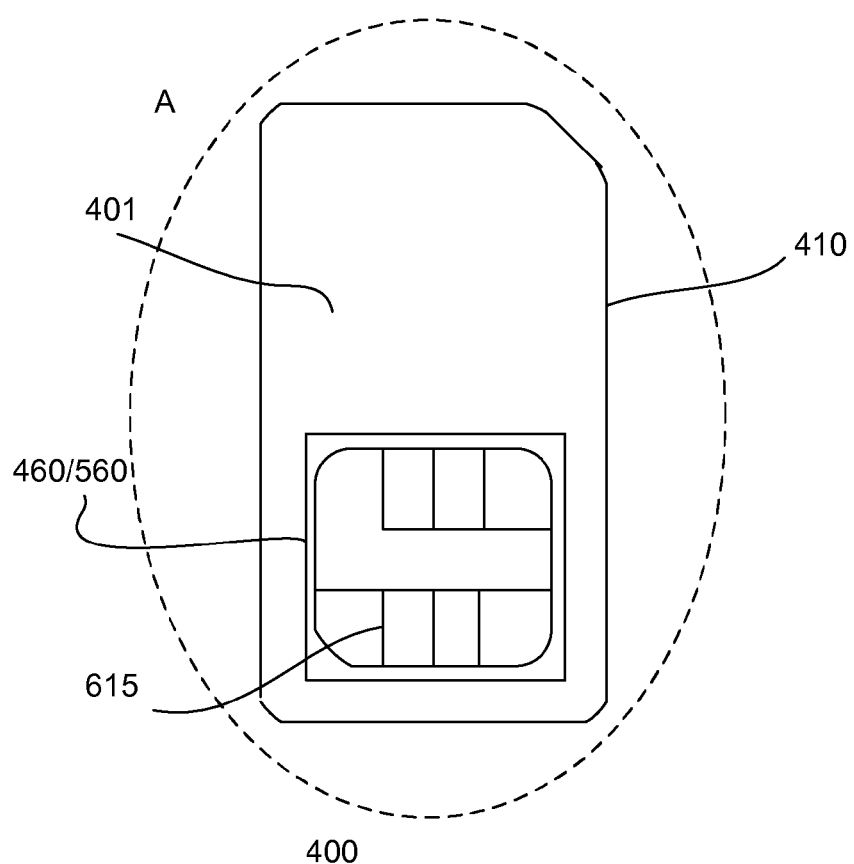
FIGS. 2a-b show various views of an embodiment of a SIM card.
Figure 2B:
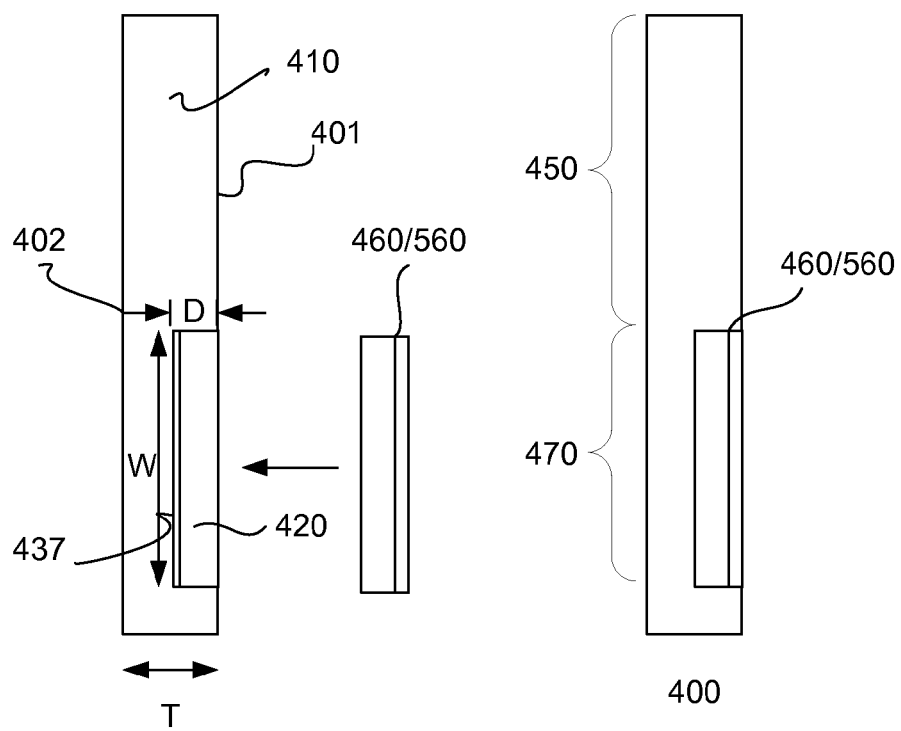

FIGS. 2a-b show an embodiment of a SIM card 400 in greater detail. FIG. 2a shows a top view and FIG. 2b shows a side view of an embodiment of a SIM card. The SIM card, in one embodiment, includes a support carrier or a support structure 410. The support carrier includes top 401 (first) and bottom 402 (second) major surfaces. The support carrier, in one embodiment, includes a first region 450 and a second region 470. The first region, for example, is an inactive region, and the second region is an active region. The active region, for example, includes a chip package 460/560.

In one embodiment, the support carrier includes a thickness T. The thickness T, for example, is about 0.68-0.84 mm. For example, the thickness T is about 0.76 mm. Providing a support carrier with other thicknesses may also be useful, depending on the specification of the standards being employed in the industry to define the SIM card thickness. In one embodiment, the support carrier includes a cavity 420 in the second or active region, as shown in FIG. 2b. In one embodiment, the cavity extends partially into the support carrier from the top major surface. In one embodiment, the dimension of the cavity is sufficient to accommodate the chip package 460/560. The width (W), in one embodiment, is greater or the same as the width of the chip package and the depth (D) is greater than or the same as the height of the chip package. For example, the width of the cavity is about 11 to 12 mm and the depth is about 0.5 to 0.6 mm. Providing other width and depth dimensions may also be useful.

The dimension of the cavity should be sufficient to accommodate the IC or chip package. The cavity can be designed to accommodate a specific type of IC chip or various sized chips to form a generic package. Generic packages offer more flexibility but may increase the package size. The cavity, for example, comprises a rectangular shape. Generally, the cavity comprises a size sufficiently big to accommodate one or more IC chips. Other sizes can also be useful.

In one embodiment, at least a portion of the support carrier includes a flexible material. In another embodiment, the support carrier includes a flexible material. The flexible material, for example, includes a flexible plastic material, such as ABS, PVC or polycarbonate. Other types of materials which are sufficiently flexible to ease the insertion into or removal of the SIM card from the SIM card holder may also be used. The support carrier having the flexible material prevents the SIM card from getting jammed when inserted into or removed from a SIM card holder.

The support carrier which includes the cavity as described above, in one embodiment, is formed by injection molding. Forming the support carrier using other techniques may also be useful. The support carrier, in one embodiment, is injection molded to the actual SIM card size depending on the standards employed in the industry.

Figure 3A:
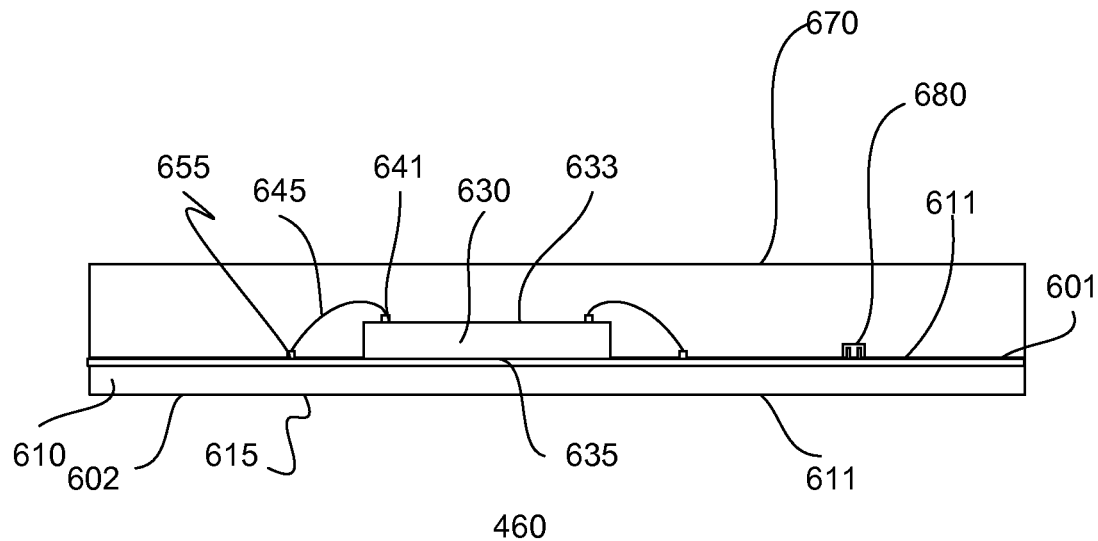
FIG. 3a-b show various embodiments of a chip package for a SIM card.
Figure 3B:
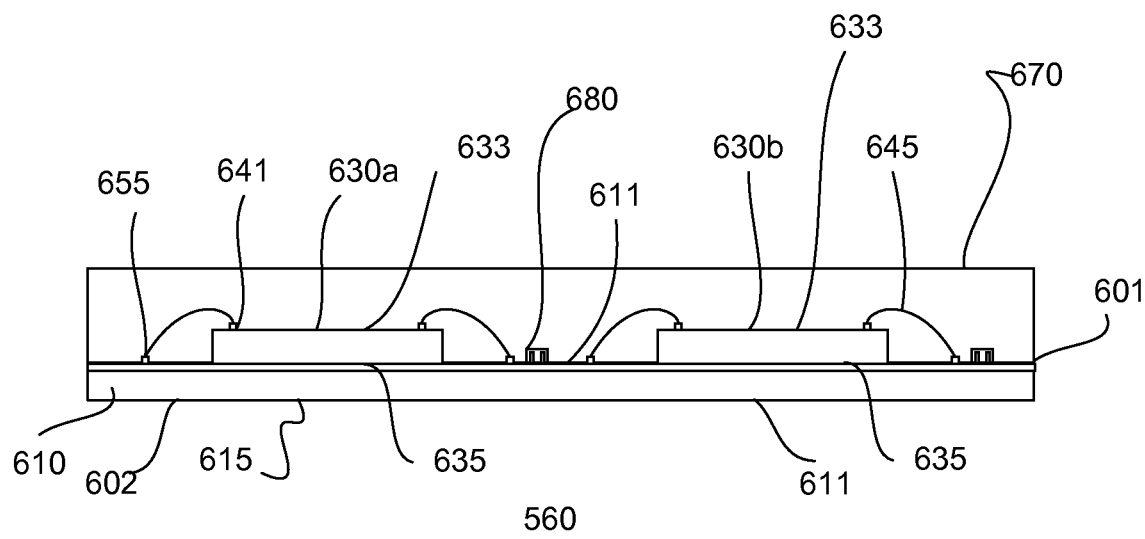

The SIM card, in one embodiment, includes a chip or chip package. FIGS. 3a-b show various embodiments of a chip package. The chip package, in one embodiment, includes a Land Grip Array (LGA) package. Providing other types of chip package may also be useful. The chip package, for example, should be sufficiently big to contain all leads required by the SIM card. Referring to FIG. 3a, a chip package 460 includes a package substrate 610 having bottom 602 and top 601 major surfaces. In one embodiment, the package substrate includes planar major surfaces. Openings (not shown) may be provided in the substrate to provide communication from one major surface to the other. Typically, the substrate comprises a rectangular shape to form a rectangular shaped device. Other shapes are also useful. The substrate can be any type of substrate, such as a PCB substrate, used for IC packages. In one embodiment, the package substrate includes multi-layer substrate. For example, the multi-layer substrate includes different layers which are laminated or built-up. Various materials, such as BT or FR can be used to form the substrate. Other types of materials are also useful.

Electrical traces 611 are formed on at least the top surface of the package substrate. Generally, electrical traces are provided on both the top and bottom surfaces. The traces on the top surface are coupled to the traces on the bottom surface by vias (not shown), which are electrically coupled to package conductive contacts 615 mounted on the bottom major surface of the substrate. In one embodiment, package pads 655 are provided on the electrical traces on the top surface for coupling with one or more chips. Providing package pads on the bottom or on both major surfaces is also useful. For substrates with multiple layers, electrical traces on the different layers are interconnected, coupling the electrical trace on the top layer to the package contacts.

The package contacts/terminals 615 are provided on the electrical traces of the bottom surface of the package substrate. The package contacts, in one embodiment, include copper or copper alloys. Other types of materials may also be used for the package contacts. The package contacts, in one embodiment, are exposed such that it can be electrically connected to electrical contacts (not shown) of the SIM card holder.

In one embodiment, the chip package 460 includes a die or chip 630 being provided on the top surface of the package substrate as shown in FIG. 3a. The chip, for example, includes SIM devices, such as memory and microprocessor chips. In one embodiment, the chip has its active surface 633 facing away from the package substrate. The inactive surface of the chip is mounted to the substrate using, for example, an adhesive 635. Preferably, the adhesive comprises an insulating adhesive. Various types of adhesives, for example, epoxy, paste or tape, can be used. Other techniques for mounting the chip to the substrate, such as adhesive tape, are also useful.

In one embodiment, an active surface of the die is provided with chip pads 641 or contact regions. The chip pads, in one embodiment, are provided at the peripheral portion of the chip. In one embodiment, the chip is electrically connected to the package substrate by wires 645. The wires, for example, are attached to chip pads of the chip to the package pads 655. The wires, in one embodiment, include gold, copper or copper alloy wires. Providing other types of conductive wires is also useful.

Although a wire bonded chip is shown in FIG. 3a, a flip chip (not shown) may be provided over the top surface of the package substrate in another embodiment. Other types of chips may also be useful.

In one embodiment, the chip package 460 further includes other component or components 680. The component, for example, may include an antenna. Other types of functional components may also be included in the chip package.

The chip package, in one embodiment, includes a cap 670 which encapsulates the chip and the component. The cap, for example, comprises a mold compound. The mold compound, for example, includes a rigid material such as an epoxy. The epoxy material, for example, includes a thermal cured epoxy. Other types of material which are sufficiently rigid may also be used. The mold compound protects the chip, the wires and other components, such as antenna. In one embodiment, the cap completely encapsulates the chip and the top surface of the package substrate as shown in FIG. 3a.

In another embodiment, the chip package 560 may include more than one die or chip. For example, the chip package includes two chips or ICs as shown in FIG. 3b. Providing other number of dies or chips is also useful, depending on design and application requirements. In one embodiment, a first chip 630a includes SIM devices such as a memory chip or microprocessor and the second chip 630b includes other types of ICs or components such as a RF IC, a decoder or a security IC. Providing other types of ICs is also useful. The chip package 560 which includes more than one IC enables various functions to be performed by one SIM card. For example, having various types of ICs in the chip package allows different functions to be performed such as NFC payment, banking system or secured data transfer. In one embodiment, the second chip is the same size as the first chip. Providing the second chip which is larger or smaller than the first chip is also useful.

The first and second chips are provided on the top surface 601 of the package substrate. In one embodiment, the first and second chip, respectively, has its active surface 633 facing away from the package substrate. The inactive surfaces of the chips are mounted to the substrate using, for example, an adhesive 635. Preferably, the adhesive comprises an insulating adhesive. Various types of adhesives, for example, epoxy, paste or tape, can be used. Other techniques for mounting the chips to the substrate, such as adhesive tape, are also useful.

In one embodiment, the active surfaces of the chips are provided with chip pads 641 or contact regions. The chip pads, in one embodiment, are provided at the peripheral portions of the chips. In one embodiment, the chips are electrically connected to the package substrate by wires 645. The wires, for example, are attached to chip pads of the chips to the package pads 655. The wires, in one embodiment, include gold, copper or copper alloy wires. Providing other types of conductive wires is also useful.

Although the first and second chips are presented as wire bonded chips as shown in FIG. 3b, one of the first and second chips may include a flip chip. Providing both the first and second chips with flip chips may also be useful. Other types of chip may also be used.

In one embodiment, the chip package 560 further includes other component or components 680. The component, for example, may include an antenna. Other types of functional components may also be included in the chip package 560.

Referring to FIG. 3b, the chip package 560 includes a cap 670 which encapsulates the first and second chips. The cap, for example, comprises a mold compound. The mold compound, for example, includes a rigid material such as an epoxy. The epoxy material, for example, includes thermal cured epoxy. Other types of material which are sufficiently rigid may also be used. The mold compound protects the chips, the wires and other components. In one embodiment, the cap completely encapsulates the first and second chips and the top surface of the package substrate as shown in FIG. 3b.

In one embodiment, the chip package, such as the chip package of FIG. 3a or 3b, is disposed in the cavity as shown in FIG. 2b to form a SIM card 400 as shown in FIG. 2a. The chip package 460/560, for example is attached or mounted to the cavity using, for example, an adhesive 437. Preferably, the adhesive comprises an insulating adhesive. Various types of adhesives, for example, glue film, epoxy, paste or tape, can be used. The adhesive, for example, is provided at the bottom surface of the cavity. Attaching or mounting the chip package using other techniques may also be useful. In one embodiment, the surface having the cap of the chip package is disposed directly on top of the adhesive. The bottom major surface 602 of the package substrate is disposed away from the adhesive and the package contacts/terminals 615 which are provided on the electrical traces 611 of the bottom major surface 602 of the package substrate are exposed. The exposed package contacts 615 enable the SIM card to be electrically connected to electrical contacts of the SIM card holder. The bottom major surface 602 of the package substrate 610 is coplanar with the top major surface 401 of the support carrier when the chip package is attached or mounted to the cavity of the support carrier.

Figure 4:
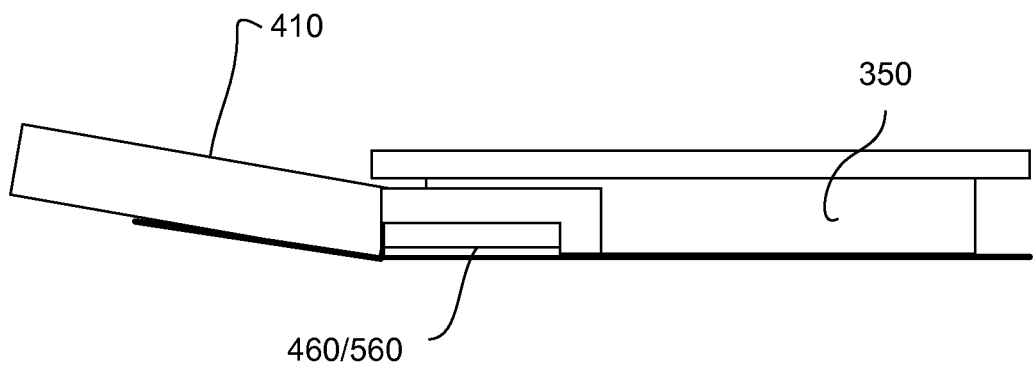
FIG. 4 shows an application of an embodiment of a SIM card.

The SIM card as described with respect to FIG. 2a includes a chip package encapsulated with a rigid mold material being disposed within a cavity of a flexible support carrier. As a result, a hybrid SIM card is formed. Referring to FIG. 4, since overmolding of the entire SIM card with the rigid mold material is avoided, the SIM card 400 as disclosed is able to bend such that it can be easily inserted into or removed from the SIM card holder 230 and the reliability of the SIM card is not compromised since the IC or the chips are protected by a rigid mold compound. Moreover, since the chip package includes a multi-functional chip package; various functions can be performed in one SIM card. In addition, the package substrate area and the mold compound required are confined to the size of the chip package, rather than the total size of the SIM card. Hence, this significantly reduces the manufacturing cost, particularly for the substrate cost which can be relatively high. Furthermore, the support carrier as described is injection molded to the actual card size. Thus, wastage of materials relative to conventional methods such as punching from a credit size panel is avoided or reduced. Moreover, the use of injection molding process to form the support carrier increases throughput, thereby lowers the manufacturing cost.

Figure 5:
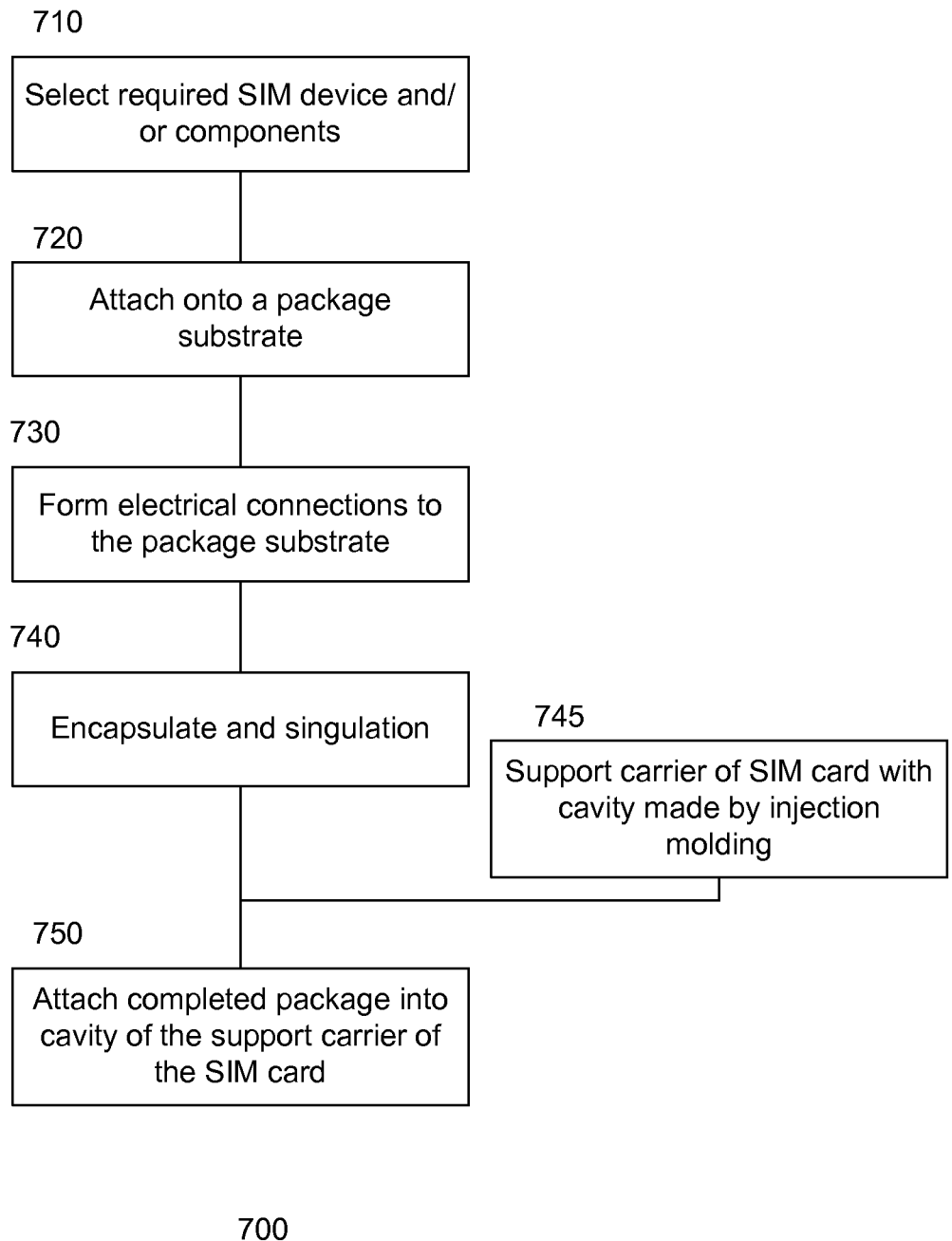
FIG. 5 shows an embodiment of a process for forming a SIM card.

FIG. 5 shows an embodiment of a process 700 for forming a SIM card. The SIM card, as described may include a multi-functional SIM card. As shown in FIG. 5, at 710, one or more chips or IC devices such as SIM devices and components are selected, depending on the required functionality and application of the SIM card. The SIM devices, for example, may include a memory chip or microprocessor chip, whereas one or more functional components may include a RF IC, a decoder or a security IC. Other types of components may also be useful.

The process continues by providing a package substrate as described with respect to FIGS. 3a and 3b. As such, the package substrate need not be described or described in detail. At 720, the chip and/or other component are attached on the top surface of the package substrate. The chip and/or other component are attached to the package substrate using, for example, adhesive. The adhesive, for example, includes epoxy, paste or tape. Other techniques for mounting the selected chip and/or components may also be useful.

The chip and the other components, in one embodiment, are electrically connected to the package substrate at 730. In one embodiment, the selected chip is electrically connected to the package substrate by wires as described with respect to FIGS. 3a and 3b. The chip may also be electrically connected to the package substrate by solder bumps or other techniques.

The process continues by providing a cap to encapsulate the chip and the other components at 740. The cap, for example, includes a mold compound. The mold compound, for example, includes a rigid material such as an epoxy. The epoxy material, for example, includes a thermal cured epoxy. Other types of material which are sufficiently rigid may also be used. The mold compound protects the chip, the wires and other components. In one embodiment, the cap completely encapsulates the chip and the top surface of the package substrate as described with respect to FIGS. 3a and 3b. The encapsulated chip package is singulated into individual chip packages.

At 745, a support carrier as described with respect to FIGS. 2a and 2b is provided. As such, the support carrier need not be described or described in detail. The support carrier, in one embodiment, includes a cavity. In one embodiment, the support carrier having the cavity is formed by injection molding. In one embodiment, the support carrier is injection molded to the actual card size.

At 750, the chip package is attached or mounted in the cavity as shown in FIG. 2b to form a multi-functional SIM card. The chip package, for example is attached or mounted to the cavity using, for example, an adhesive. Preferably, the adhesive comprises an insulating adhesive. Various types of adhesives, for example, glue film, epoxy, paste or tape, can be used. The adhesive, for example, is provided at the bottom surface of the cavity. Attaching or mounting the chip package using other techniques may also be useful. In one embodiment, the surface having the cap of the chip package is disposed directly on top of the adhesive. The bottom major surface of the package substrate is disposed away from the adhesive and the package contacts/terminals which are provided on the electrical traces of the bottom major surface of the package substrate are exposed. The exposed package contacts enable the SIM card to be electrically connected to electrical contacts of the SIM card holder.

The process 700 as described includes a chip package encapsulated with a rigid mold being disposed within a cavity of a flexible support carrier. As such, a hybrid SIM card is formed. Since overmolding of the entire SIM card with a rigid material is avoided in the process, the SIM card as disclosed is able to bend such that it can be easily inserted into or removed from the SIM card holder and the reliability of the SIM card is not compromised since the IC or the chips are protected by a rigid mold compound. Moreover, since the chip package includes a multi-functional chip package; various functions can be performed in one SIM card. In addition, the package substrate area and the mold compound required are confined to the size of the chip package, rather than the total size of the SIM card. Hence, this significantly reduces the manufacturing cost. Furthermore, the support carrier as described is injection molded to the actual card size. Thus, wastage of materials relative to conventional methods such as punching from a credit size panel is avoided or reduced. Moreover, the use of injection molding process to form the support carrier increases throughput, thereby lowers the manufacturing cost.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A SIM card comprising:
    a support carrier having a first and a second major surface, the support carrier having a cavity which extends partially into the carrier from the first major surface, wherein the cavity includes sidewalls and a bottom surface, the sidewalls are contiguous with the first major surface of the support carrier and the bottom surface is a continuous planar surface which is contiguous with bottom of the sidewalls;
    an adhesive disposed over the bottom surface of the cavity; and
    a chip package attached within the cavity, the chip package having a cap which encapsulates at least one SIM device disposed on a top surface of a package substrate,
    wherein the cap contacts the adhesive disposed over the bottom surface of the cavity and the support carrier is sufficiently flexible to bend when the SIM card is being inserted into or removed from a SIM card holder.

2. The SIM card of claim 1 wherein the chip package includes a multi-functional chip package.

3. The SIM card of claim 2 wherein the multi-functional chip package includes at least one functional component disposed on the top surface of a package substrate.

4. The SIM card of claim 3 wherein:
    the at least one SIM device includes a memory chip or a microprocessor chip; and
    the at least one functional component includes a RF IC, a decoder or a security chip.

5. The SIM card of claim 3, wherein the support carrier includes a flexible plastic material.

6. The SIM card of claim 5 wherein the flexible plastic material includes ABS, PVC or polycarbonate.

7. The SIM card of claim 3 wherein the cap encapsulates the at least one functional component disposed on the top surface of a package substrate.

8. The SIM card of claim 2 wherein the multi-functional chip package includes a multi-layer substrate.

9. The SIM card of claim 1 wherein the support carrier comprises an injection molded support carrier.

10. The SIM card of claim 9 wherein the support carrier is injection molded to an actual size of the SIM card.

11. A method for forming a SIM card, comprising:
    providing a support carrier having a first and a second major surface, the support carrier having a cavity which extends partially into the carrier from the first major surface, wherein the cavity includes sidewalls and a bottom surface, the sidewalls are contiguous with the first major surface of the support carrier and the bottom surface is a continuous planar surface which is contiguous with bottom of the sidewalls;
    providing an adhesive over the bottom surface of the cavity;
    providing a chip package having a cap which encapsulates at least one SIM device disposed on a top surface of a package substrate; and
    attaching the chip package within the cavity,
    wherein the cap contacts the adhesive disposed over the bottom surface of the cavity, the SIM card is formed without overmolding and the support carrier is sufficiently flexible to bend when the SIM card is being inserted into or removed from a SIM card holder.

12. The method of claim 11 wherein the chip package includes a multi-functional chip package.

13. The method of claim 12 wherein the multi-functional chip package is formed by selecting the at least one SIM device and at least one functional component and attached on the top surface of a package substrate.

14. The method of claim 13 wherein:
    the at least one SIM device includes a memory chip or a microprocessor; and
    the at least one functional component includes a RF IC, a decoder or a security chip.

15. The method of claim 13 wherein the cap encapsulates the at least one functional component disposed on the top surface of a package substrate.

16. The method of claim 15 comprises forming electrical connections to electrically connect the at least one SIM device and at least one functional component to the package substrate.

17. The method of claim 11 wherein the package substrate includes a bottom surface, the bottom surface of the package substrate is coplanar with the first major surface of the support carrier.

18. The method of claim 11 wherein the support carrier is formed by injection molding into an actual size of the SIM card.

19. The method of claim 18 wherein the support carrier includes a flexible plastic material.

20. The SIM card of claim 1 wherein the package substrate includes a bottom surface, the bottom surface of the package substrate is coplanar with the first major surface of the support carrier.

* * * * *